United States Patent [19]

Yamazaki

[11] 4,437,009
[45] Mar. 13, 1984

[54] SCANNING ELECTRON MICROSCOPE OR SIMILAR EQUIPMENT

[75] Inventor: Shigetomo Yamazaki, Hachioji, Japan

[73] Assignee: Kabushiki Kaisha Akashi Seisakusho, Tokyo, Japan

[21] Appl. No.: 347,863

[22] Filed: Feb. 11, 1982

[30] Foreign Application Priority Data

Mar. 3, 1981 [JP] Japan ................................. 56-30266

[51] Int. Cl.³ .................... H01F 7/00; G01N 23/00
[52] U.S. Cl. .......................... 250/396 ML; 250/311; 335/210
[58] Field of Search ........... 250/396 ML, 396 R, 310, 250/311; 335/210, 212

[56] References Cited

U.S. PATENT DOCUMENTS 3,448,262 6/1969 Akahori ............................ 250/396
3,872,305 3/1975 Koike ............................... 250/311

FOREIGN PATENT DOCUMENTS 1146054 11/1957 France ............................. 250/311
51-42271 10/1976 Japan .
2071403 9/1981 United Kingdom ............... 250/311

Primary Examiner—Alfred E. Smith
Assistant Examiner—T. N. Grigsby
Attorney, Agent, or Firm—Robert E. Burns; Emmanuel J. Lobato; Robert E. Burns

[57] ABSTRACT

The specification describes a scanning electron microscope or similar equipment having a magnetic pole piece detachably provided in an opening of a lower pole of its electromagnetic objective lens so as to decrease the magnetic flux leaked through the opening when the specimen is placed below the lower pole. The above scanning electron microscope or similar equipment may also include a change-over system for varying the crossing point between a scanning charged particle beam and an optical axis depending whether the specimen is placed in the vicinity of the lens center of the objective lens or below the lower pole. Accordingly, the specimen can be placed either below the lower pole of the objective lens or in the vicinity of the lens center as the operator desires, thereby making the scanning electron microscope or similar equipment applicable for varied purposes. Owing to the provision of the change-over system, a specimen image of good quality can always be obtained even if the specimen is placed at different locations.

6 Claims, 6 Drawing Figures

SCANNING ELECTRON MICROSCOPE OR SIMILAR EQUIPMENT

BACKGROUND OF THE INVENTION (1) Field of the Invention

This invention relates to a scanning electron microscope or similar equipment, and more particularly to a scanning electron microscope or similar equipment provided with a magnetic pole piece to decrease the magnetic flux leaked through an opening of a lower pole of an electromagnetic objective lens.

(2) Description of the Prior Art

A conventional scanning electron microscope is accompanied by a drawback that, as shown in FIG. 1, its resolution is limited to an order of 60–70 Å or so because it is designed to place a specimen c below the lower pole b of an electromagnetic objective lens a and it thus has a long focal distance and a large aberration coefficient.

It may be conceivable to place the specimen c in the vicinity of the lens center g of the objective lens a (here, the lens center g is located above the lower pole (b) for the purpose of improving its resolution. However, such a measure is known to involve the following problems:

(1) The diameter of the opening of the lower pole b has to be great to permit a disposition of the specimen c at a point above the lower pole b. Accordingly, when the specimen c is placed below the lower pole b, more magnetic flux tends to leak through the thus-enlarged opening of the lower pole b, thereby deleteriously affecting the collection of secondary electrons and magnetizing the magnetic specimen, and, corollary to this, lowering the S/N ratio(signal-to-noise ratio) and consequently deteriorating the quality of an image to be obtained.

(2) The crossing point between the scanning beam and optical axis cannot be changed even when the position of the specimen c is varied. Accordingly, it is impossible to select optimum lens conditions in accordance with the position of the specimen c. This results in a poor image quality.

In FIG. 1, letters d, e and f designate a detector, amplifier and cathode-ray tube respectively.

SUMMARY OF THE INVENTION

The present invention contemplates to solve the above-described drawbacks or problems of the prior art scanning electron microscopes and similar equipments. Thus, the object of this invention is to provide a scanning electron microscope or similar equipment which can always provide a specimen image of good quality regardless of the location of the specimen so as to make itself applicable for varied purposes.

To achieve the above object, the present invention provides in one aspect a scanning electron microscope or similar equipment, which comprises an electromagnetic objective lens having its lens center between the upper and lower poles thereof, an opening formed on said lower pole so that a specimen may be passed through the opening and placed in the vicinity of the lens center, and a magnetic pole piece defining an aperture having a diameter smaller than that of the opening and detachably provided in the opening so as to decrease the magnetic flux leaked through the opeing when the specimen is placed below the lower pole.

In another aspect of this invention, the above scanning electron microscope or similar equipment further comprises a change-over system for varying the crossing point between a scanning charged particle beam and an optical axis depending whether the specimen is placed in the vicinity of the lens center or below the lower pole.

Owing to the above features of this invention, the following effects and/or merits have been brought about:

(1) A specimen can be placed either below the lower pole of the objective lens or in the vicinity of the lens center of the objective lens as the operator desires, thereby making the scanning electron microscope or similar equipment applicable for varied purposes.

(2) A specimen image of good quality can always be obtained even if a specimen is placed at different locations as above.

BRIEF DESCRIPTION OF THE DRAWINGS

In order that the invention may be clearly understood and readily carried into effect, a preferred embodiment of this invention will now be described, by way of example only, with reference to the accompanying drawings of which.

DETAILED DESCRIPTION OF THE PREFERRED EMBODIMENT

Figure 1:
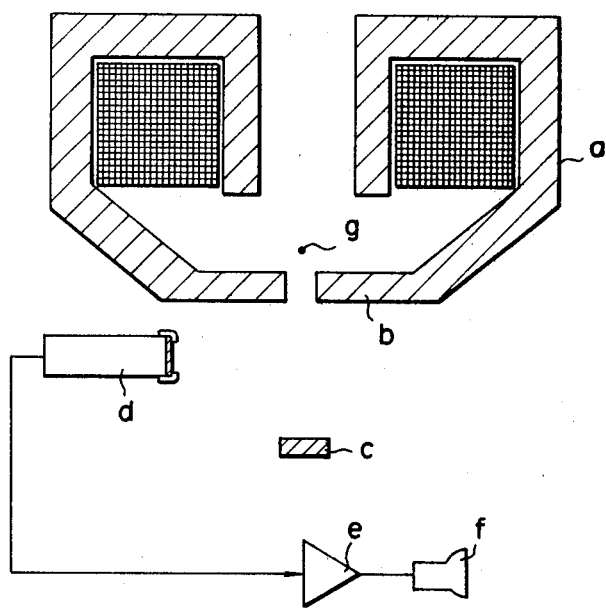
FIG. 1 is a schematic illustration of both electron beam focusing system and detection system in a conventional scanning electron microscope.
Figure 2:
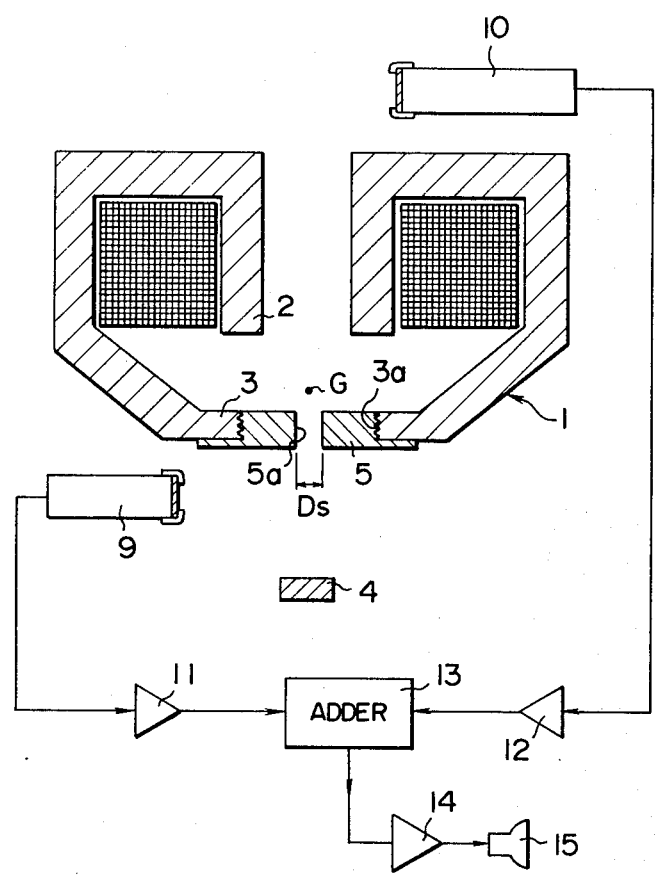
FIG. 2 illustrates schematically a scanning electron microscope according to one embodiment of this invention, in which a specimen is placed below the lower pole of the objective lens thereof.
Figure 3:
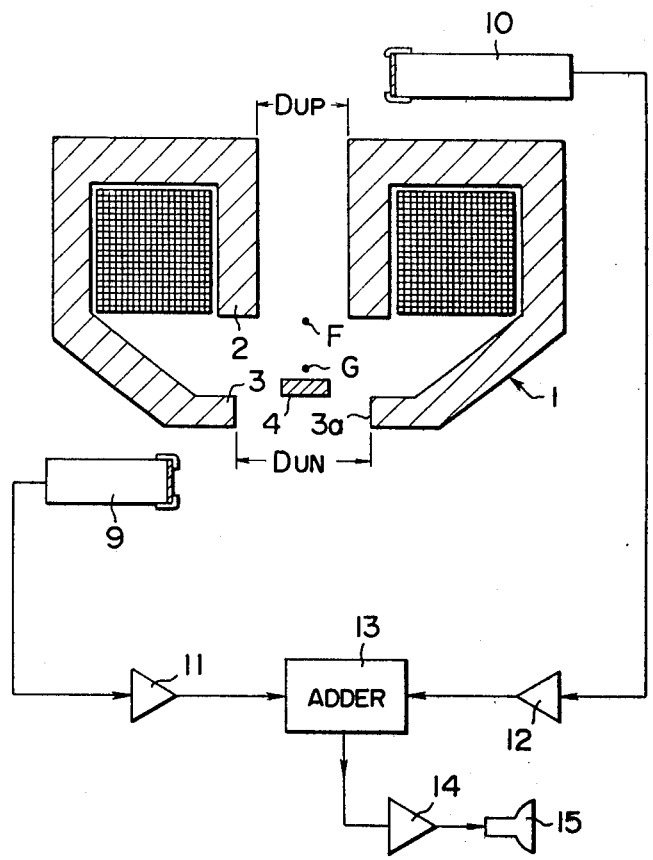
FIG. 3 is similar to FIG. 2 but the specimen is placed in the vicinity of the lens center of the objective lens.

As depicted in FIGS. 2 and 3, the scanning electron microscope according to one embodiment of this invention has an electromagnetic objective lens 1 disposed at a lower position in a microscope column. This objective lens 1 is constructed as a lens having its lens center G between its upper pole 2 and lower pole 3.

The lower pole 3 of the objective lens 1 defines an opening 3a adapted to pass a specimen 4 and a specimen stage therethrough, whereby permitting to place the specimen 4 in the vicinity of the lens center G. The diameter $D_{UN}$ of the opening in the lower pole 3 is generally 15 mm or greater in commercially available scanning electron microscopes.

On the other hand, the upper pole 2 also defines an opening therethrough. Its diameter $D_{UP}$ is also 15 mm or greater in commercially available scanning electron microscopes. The diameter $D_{UP}$ ranges for example from 20 to 30 mm. The ratio of the diameters $D_{UP}$ to $D_{UN}$, namely, $D_{UP}/D_{UN}$ generally ranges from 0.6 to 1.6.

As shown in FIG. 2, the scanning electron microscope is also provided with a magnetic pole piece 5, which can be screwed up in the opening 3a of the lower pole 3. This magnetic pole piece 5 defines a small aperture 5a, the diameter of which is smaller than the diameter of the opening 3a. The diameter $D_S$ of the small aperture 5a is generally of the order of 10 mm or so in commercially available scanning electron microscopes.

Accordingly, when the magnetic pole piece 5 is mounted in the opening 3a, it is possible to considerably decrease the magnetic flux to be leaked through the opening 3a. Owing to the magnetic pole piece 5 mounted in the opening 3a, an image of substantially improved quality can be obtained even when the specimen 4 is placed below the lower pole 3 of the objective lens 1.

Figure 5:
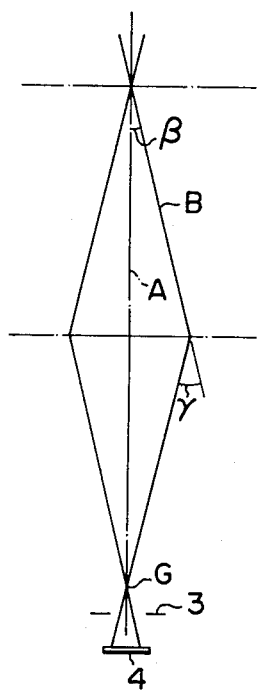
FIGS. 5 and 6 are each a schematic illustration showing the crossing point between the scanning beam and optical axis.
Figure 6:
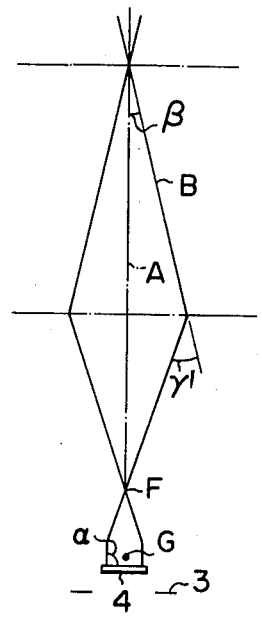

A crossing point change-over system C is connected with a deflection member so as to change over the crossing point of the scanning beam and optical axis, as shown in FIGS. 5 and 6, depending whether the specimen 4 is placed below the lower pole 3 of the objective lens 1 or in the vicinity of the lens center G of the objective lens 1.

Figure 4:
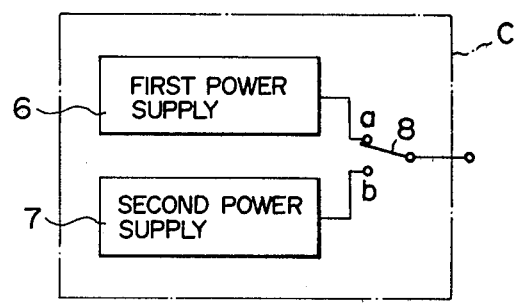
FIG. 4 is a block diagram of a crossing point change-over system adopted in the scanning electron microscope shown in FIGS. 2 and 3.

The crossing point change-over system C is constituted, as shown in FIG. 4, by a first and second power supplies 6, 7 adapted to output D.C. electric signals of different values respectively and a change-over switch 8 for feeding either one of the electric signals from the power supplies 6, 7 to a deflection member (not illustrated) in accordance with the location of the specimen 4.

More specifically speaking, when the specimen 4 is placed below the lower pole 3 of the objective lens 1 as shown in FIG. 2, the change-over switch 8 is turned to a terminal a (see FIG. 4) and the signal from the first power supply 6 is fed to the unillustrated deflection member. The deflection member is then actuated with a deflection angle ratio $(\beta/Y)$ which is determined by the signal from the first power supply 6. By the deflection angle ratio, the crossing point between the scanning beam B and optical axis A is brought into coincidence with the lens center G of the objective lens 1 as depicted in FIG. 5.

On the other hand, when the specimen is placed in the vicinity of the lens center G of the objective lens 1 as shown in FIG. 3, the change-over switch 8 is turned to a terminal b (see FIG. 4) and the signal from the second power supply 7 is fed to the above-described deflection member. The deflection member is then actuated with another deflection angle ratio $[\beta/Y'(\neq \beta/Y)]$ which is determined by the signal from the second power supply 7. By the another deflection angle ratio, the crossing point between the scanning beam B and optical axis A is moved to a forward focal point F of the objective lens 1 under the influence of a forward magnetic field of the specimen, thereby making the angle $\alpha$ of the incident beam to the specimen 4 be substnatially a right angle.

Below the lower pole 3 of the objective lens 1, there are provided one or more lower detectors 9. On the other hand, one or more upper detectors 10 are disposed above the objective lens 1. These detectors 9, 10 are connected to a common adder 13 through their respective amplifiers 11, 13. The adder 13 is in turn connected to a cathode-ray tube 15 via an amplifier 14.

Accordingly, when a specimen 4 is placed below the lower pole 3 of the objective lens 1 to observe its image, it is necessary, as shown in FIG. 2, to mount in the opening 3a of the lower pole 3 the magnetic pole piece 5 having the small aperture 5a and to turn, either automatically or manually, the change-over switch 8 to the terminal a.

Then, the specimen 4 is scanned two-dimensionally by an electron beam in a manner known per se in the art. Secondary electrons and the like particles given off from the specimen 4 are then detected by the lower detector 9 principally. Then, the cathode-ray tube 15 is subjected to intensity modulation by virtue of a signal from the detector 9, thereby displaying an image of the specimen 4 on the screen of the cathode-ray tube 15 for observation.

The thus-obtained image is of good quality since the scanning beam B intersects with the optical axis A at the lens center G of the objective lens 1 and, in addition, the leakage of magnetic flux is considerably decreased by the magnetic pole piece 5.

When the specimen 4 is placed in the vicinity of the lens center G of the objective lens 1 to observe its image, it is required to detach the magnetic pole piece 5 from the lower pole 3, to insert the specimen 4 to a point near the lens center G of the objective lens 1 through the opening 3a of the lower lens 3 of the objective lens 1, and then to turn, either automatically or manually, the change-over switch 8 to the terminal b.

Thereafter, the specimen 4 is scanned two-dimensionally by an electron beam in a manner known per se in the art. Secondary electrons and the like particles given off from the specimen 4 are mainly detected by the upper detector 10. Then, the cathode-ray tube 15 is subjected to intensity modulation by a detection signal from the detector 10, thereby displaying an image of the specimen 4 on the screen of the cathode-ray tube 15 for observation. Owing to the above-described arrangement, the resolution has been improved from the order of 70 Å to the order of 30 Å and, in addition, the quality of images has also been improved because the scanning beam B and optical axis A intersect at the forward focal point F.

Although a screw-up method is employed as means for mounting the magnetic pole piece 5 in the opening 3a in the above embodiment, a wide variety of mounting means may be employed including a fit-in method.

Although the invention has been described specifically with respect to a scanning electron microscope, the present invention may also be applied to various equipments similar to scanning electron microscopes.

Having now fully described the invention, it will be apparent to one of ordinary skill in the art that many changes and modifications can be made thereto without departing from the spirit or scope of the invention as set forth herein.

What is claimed is:

1. A scanning electron microscope or similar equipment, comprising an electromagnetic objective lens having its lens center between the upper and lower poles thereof, an opening formed on the lower pole so that a specimen may be passed through the opening and placed in the vicinity of the lens center, and a magnetic pole piece defining an aperture having a diameter smaller than that of the opening and detachably provided in the opening so as to decrease the magnetic flux leaked through the opening when the specimen is placed below the lower pole.

2. The scanning electron microscope or similar equipment as claimed in claim 1, further comprising a change-over system for varying the crossing point between a scanning charged particle beam and an optical axis depending whether the specimen is placed in the vicinity of the lens center or below the lower pole.

3. The scanning electron microscope or similar equipment as claimed in claim 2, wherein the change-over system comprises two power supplies adapted to output D.C. electric signals of different values respectively, and a change-over switch for feeding either one of the electric signals from the power supplies to a deflection member in accordance with the location of the specimen.

4. The scanning electron microscope or similar equipment as claimed in claim 3, wherein the values of the D.C. signals from the power supplies of the change-over system are adjusted in such a way that the crossing point between the scanning charged particle beam and the optical axis coincides with the lens center of the objective lens when the specimen is placed below the lower pole of the objective lens whereas the crossing point between the scanning charged particle beam and the optical axis coincides with a forward focal point of the objective lens under the influence of a forward magnetic field of the specimen when the specimen is placed in the vicinity of the lens center of the objective lens.

5. The scanning electron microscope or similar equipment as claimed in claim 1, wherein said upper pole defines an opening, the openings of said upper and lower poles are each at least 15 mm in diameter, and the ratio of the opening of the upper pole to that of the lower pole ranges from 0.6 to 1.6.

6. The scanning electron microscope or similar equipment as claimed in claim 1, wherein said magnetic pole piece is provided with an externally threaded portion formed therein while the lower pole defines a corresponding internally threaded portion in the wall of its opening, whereby permitting to screw up the magnetic pole piece in the opening of the lower pole.

* * * * *